(12) United States Patent
Rosocha

(10) Patent No.: US 7,063,819 B2
(45) Date of Patent: Jun. 20, 2006

(54) NONTHERMAL PLASMA PROCESSOR UTILIZING ADDITIVE-GAS INJECTION AND/OR GAS EXTRACTION

(75) Inventor: Louis A. Rosocha, Los Alamos, NM (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/395,046

(22) Filed: Mar. 21, 2003

(65) Prior Publication Data

US 2004/0182314 A1   Sep. 23, 2004

(51) Int. Cl.
  *B01J 19/08* (2006.01)
(52) U.S. Cl. .................... 422/186.04; 60/275
(58) Field of Classification Search ........... 422/186.04; 60/275
  See application file for complete search history.

(56) References Cited

U.S. PATENT DOCUMENTS 6,139,694 A * 10/2000 Rogers et al. ............. 204/177
6,245,299 B1 * 6/2001 Shiloh et al. .............. 422/121

OTHER PUBLICATIONS

Chang, M.B. et al.; "NO/NOX Removal with C2H2 as Additive Via Dielectric Barrier Discharges," AlChE Journal, vol. 47, pp. 1226-1233 (2001).
Rosocha, L.A.; "NOX Removal in Jet-Engine Exhaust: Proposed Non-Thermal Plasma Systems and Economic Considerations," Abstracts of 1999 IEEE International Conference on Plasma Science, Jun. 20-24, 1999, Monterey, CA. (Abstract).
Urashima, K. et al.; "Acid Gas Removal Characteristics of Corona Discharge Methane Radical Shower-Catalyst Hybrid System for Treatment of Jet Engine Test Cell Flue Gas," Proceedings of 1999 Society of Automotive Engineers International Fuels & Lubricants Meeting, paper 99FL-258, SAE Publication SP-1483, Non-Thermal Plasma for Exhaust Emission Control: NOx, HC, and Particulates, pp. 15-21, (Oct. 1999).
Park, J.Y. et al.; "Simultaneous Removal of NOx and SO2 From No—SO2—CO2—N2—O2 Gas Mixtures by Corona Radical Shower Systems," J. Phys. D: Appl. Phys., vol.. 32, pp. 1006-1011 (1999).

(Continued)

*Primary Examiner*—Kishor Mayekar
(74) *Attorney, Agent, or Firm*—John P. O'Banion

(57) ABSTRACT

A device for processing gases includes a cylindrical housing in which an electrically grounded, metal injection/extraction gas supply tube is disposed. A dielectric tube surrounds the injection/extraction gas supply tube to establish a gas modification passage therearound. Additionally, a metal high voltage electrode circumscribes the dielectric tube. The high voltage electrode is energizable to create nonthermal electrical microdischarges between the high voltage electrode and the injection/extraction gas supply tube across the dielectric tube within the gas modification passage. An injection/extraction gas and a process gas flow through the nonthermal electrical microdischarges within the gas modification passage and a modified process gas results. Using the device contaminants that are entrained in the process gas can be destroyed to yield a cleaner, modified process gas.

27 Claims, 10 Drawing Sheets

OTHER PUBLICATIONS

Urashima K. et al.; "Reduction of NOx From Combustion Flue Gases by Superimposed Barrier Discharge Plasma Reactors," IEEE Trans. Industry Appl., vol. 33, pp. 879-886, (1997).

Kanazawa, S. et al.; "Removal of NOx From Flue Gas by Corona Discharge Activated Methane Radical Showers," J. Electrostatics, vol. 40-41, pp. 651-656, (1997).

Ohkubo, T. et al.; "Time Dependence of NOx Removal Rate by a Corona Radical Shower System," IEEE Trans. Industry Appl., vol. 32, pp. 1058-1062, (1996).

Urashima, K. et al.; "Reduction of NOx from Natural Gas Combustion Flue Gases by Corona Discharge Radical Injection Techniques," Conference Record of the 1996 IEEE Industry Application Conference, 31st Annual IAS Meeting, Oct. 6-10, 1996, San Diego, CA. (Abstract).

* cited by examiner

US 7,063,819 B2

NONTHERMAL PLASMA PROCESSOR UTILIZING ADDITIVE-GAS INJECTION AND/OR GAS EXTRACTION

STATEMENT REGARDING FEDERALLY SPONSORED RESEARCH OR DEVELOPMENT

This invention was made with Government support under Contract No. W-7405-ENG-36, awarded by the Department of Energy. The Government has certain rights in this invention.

CROSS-REFERENCE TO RELATED APPLICATIONS

Not Applicable

INCORPORATION-BY-REFERENCE OF MATERIAL SUBMITTED ON A COMPACT DISC

Not Applicable

BACKGROUND OF THE INVENTION

1. Field of the Invention

This invention pertains generally to devices for processing contaminated/polluted gases or gases to be used as feedstocks for chemical synthesis/modification, and more particularly to non-thermal plasma reactors.

2. Description of Related Art

The emission and discharge of volatile organic compounds (VOCs) are strictly regulated by the U.S. Conservation and Recovery Act (RCRA), the National Pollutant Discharge Elimination System (NPDES), and the National Emissions Standards for Hazardous Air Pollution regulations (NESHAPS). Technical and regulatory difficulties associated with current VOC and HAP treatment methods such as air-stripping (dilution), activated-carbon absorption, incineration, and thermal-catalytic treatment have prompted the search for alternatives. The drawbacks of present methods result in ineffective treatment, the generation of large secondary waste streams, and increased costs. It is also recognized that, for example, to operate fossil-fueled motor vehicles and other combustion-related engines or machinery under higher efficiency and reduced pollution output conditions in the future, it is desirable to have clean-burning, energy-efficient, hydrocarbon liquid fuels. This invention can also be used to synthesize such fuels from gaseous feedstocks.

The present invention has recognized these prior art drawbacks, and has provided the below-disclosed solutions to one or more of the prior art deficiencies.

BRIEF SUMMARY OF THE INVENTION

This invention overcomes many of these drawbacks and enables the end user to effectively treat VOCs and HAPs while meeting regulations in a timely and economical fashion. In addition to VOCs/HAPs, this invention shows promise for treating other air pollutants and hazardous/toxic chemicals in gases (e.g., acid rain precursors NOx and SOx, odor causing chemicals, chemical/biological warfare agents, and industrial emissions). Additionally, higher-order hydrocarbons (e.g., for motor vehicle fuels) can be synthesized using a nonthermal plasma (NTP) device according to the present invention.

By way of example, and not of limitation, the present invention is a device that employs electrical discharges/nonthermal plasmas in a gaseous medium to destroy air pollutants or undesirable chemicals/chemical or biological agents; process chemicals, or synthesize chemical compounds. In nonthermal plasmas, the electrons are "hot", while the ions and neutral species are "cold" which results in little waste enthalpy being deposited in a process gas stream. This is in contrast to thermal plasmas, where the electron, ion, and neutral-species energies are in thermal equilibrium (or "hot") and considerable waste heat is deposited in the process gas. The present invention utilizes a method for injecting additive gases/chemical compounds into the process gas stream to increase the efficiency and/or selectivity of the plasma processing. In prior-art dielectric-barrier (DB) reactors, an additive, e.g., an injection/extraction gas, has not been applied. Doing so allows for a greater variety of active species to be produced with associated increases in effective active species yields. Also, some chemical injectants (e.g., those with low photoionization cross sections) can be used to "seed" the discharge so a more homogeneous bulk-volume plasma results. This can provide advantages in terms of spreading the active species over the plasma reactor volume and, thereby, decreasing deleterious active species consumption mechanisms (e.g., radical-radical recombination).

In the present invention, the NTP reactor is applied to gas streams containing hazardous/toxic, or other undesirable pollutants or contaminants and to gas streams that are to be processed (i.e., changed in chemical form or transformed into other useful products).

In one aspect of the present invention, a device for processing contaminated gases includes a high voltage electrode and a ground electrode that is slightly spaced from the high voltage electrode. A dielectric layer is disposed in close contact with the high voltage electrode between the high voltage electrode and the ground electrode. Moreover, a gas modification passage is established within the housing between the dielectric layer and the ground electrode. A process gas supply provides a process gas to the gas modification passage and an injection/extraction gas supply provides an injection/extraction gas to the gas modification passage. The high voltage electrode is energizable to create nonthermal electrical microdischarges between the high voltage electrode and the ground electrode, distributed over the dielectric layer area within the gas modification passage. As the process gas and the injection/extraction gas flow through the gas modification passage, the process gas is modified to yield a modified process gas in which entrained pollutants have been destroyed. Or, the process gas can be modified to yield a fuel that can be more easily and efficiently combusted with less resultant pollution.

In another aspect of the present invention, a device for processing gases includes a gas modification passage that defines a length. The device further includes a means for supplying a process gas to the gas modification passage and a means for supplying an injection/extraction gas to the gas modification passage. Further, the device includes means for creating non-thermal electrical microdischarges along the length of the gas modification passage.

In yet another aspect of the present invention, a device for processing gases includes a cylindrical housing. A metal injection/extraction gas supply tube is disposed within the housing and is electrically grounded. A first dielectric tube surrounds the injection/extraction gas supply tube. Moreover, a gas modification passage is established between the injection/extraction gas supply tube and the first dielectric tube. In this aspect, a metal high voltage electrode circumscribes the first dielectric tube. The high voltage electrode is energizable to create nonthermal electrical microdischarges between the high voltage electrode and the injection/extraction gas supply tube along the length of the gas modification passage.

In still another aspect of the present invention, a device for processing gases includes a rectangular box-shaped housing. A metal, rectangular, plate-shaped injection/extraction gas manifold is disposed within the housing. The injection/extraction gas manifold is formed with injection/extraction gas passages and is electrically grounded. Further, a rectangular, dielectric plate is installed in the housing such that it is slightly spaced from the injection/extraction gas manifold. A gas modification passage is established between the ground electrode and the dielectric layer. This aspect of the present invention further includes a metal, rectangular, plate-shaped high voltage electrode that is adjacent to the dielectric layer. The high voltage electrode is energizable to create nonthermal electrical microdischarges between the high voltage electrode and the injection/extraction gas manifold along the length of the gas modification passage.

In yet still another aspect of the present invention, a device for processing gases includes a rectangular box-shaped housing. A metal, rectangular, plate-shaped high voltage electrode is installed within the housing. Moreover, a rectangular, first dielectric plate is installed within the housing adjacent to the high voltage electrode. Further, the device includes a rectangular, second dielectric plate that is slightly spaced from the first dielectric plate. A metal, rectangular, plate-shaped ground electrode is adjacent to the second dielectric plate. In this aspect, a gas modification passage is established between the first dielectric plate and the second dielectric plate. Additionally, an injection/extraction gas manifold flanks the first dielectric plate and the second dielectric plate. The injection/extraction gas manifold is formed with an injection/extraction gas passage that is in fluid communication with the gas modification passage. Also, the high voltage electrode is energizable to create nonthermal electrical microdischarges between the high voltage electrode and the ground electrode along the length of the gas modification passage.

In still another aspect of the present invention, a method for processing gases includes establishing a gas modification passage. Nonthermal electrical microdischarges are created along the length of the gas modification passage. A process gas is provided to the gas modification passage such that the process gas flows through the nonthermal electrical microdischarge. Also, an injection/extraction gas is provided to the gas modification passage such that the injection/extraction gas flows through the nonthermal electrical microdischarges with the process gas.

An object of the invention is to provide a relatively high degree of contaminant removal.

Another object of the invention is to decrease contaminant-removal costs.

Another object of the invention is to provide more efficient and/or selective chemical processing/synthesis.

Another object of the invention is to provide nonthermal treatment of contaminated gases.

Another object of the invention is to provide simultaneous destruction and removal of multiple pollutants.

Another object of the invention is to eliminate the need for fuels or catalysts.

Another object of the invention is the potential for self catalysis in the gas phase due to chain-reaction propagators resulting from the additive gas.

Another object of the invention is to provide a broad dynamic range for treating both rich and lean streams.

Another object of the invention is the ability to construct in both cylindrical and rectangular geometries.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus generally shown in FIG. 1 through FIG. 10. It will be appreciated that each apparatus may vary as to configuration and as to details of the parts, and that the method may vary as to the specific steps and sequence, without departing from the basic concepts as disclosed herein.

Figure 1:
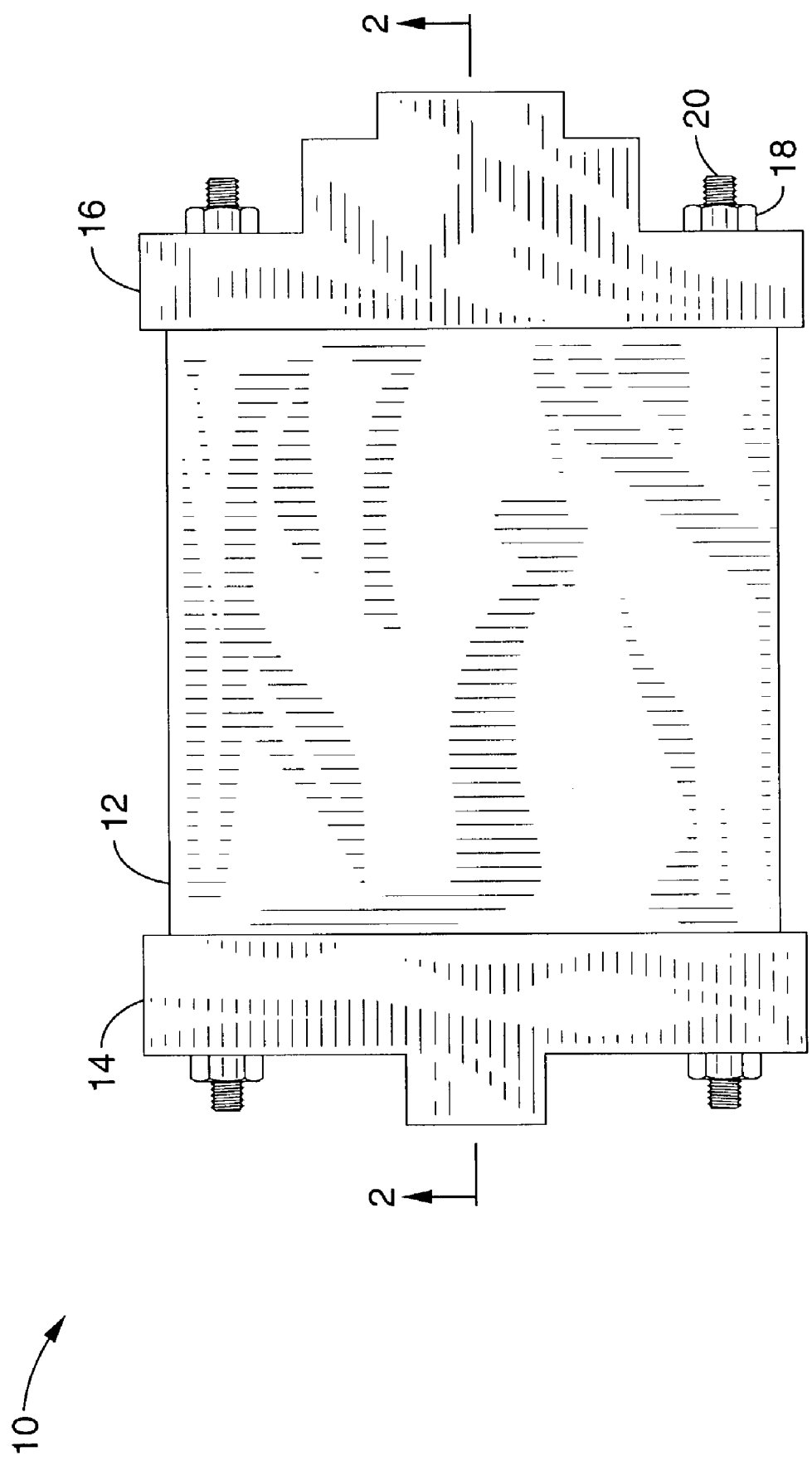
FIG. 1 is a side plan view of a first embodiment of a silent discharge plasma/dielectric barrier discharge (SDP/DBD) reactor.
Figure 2:
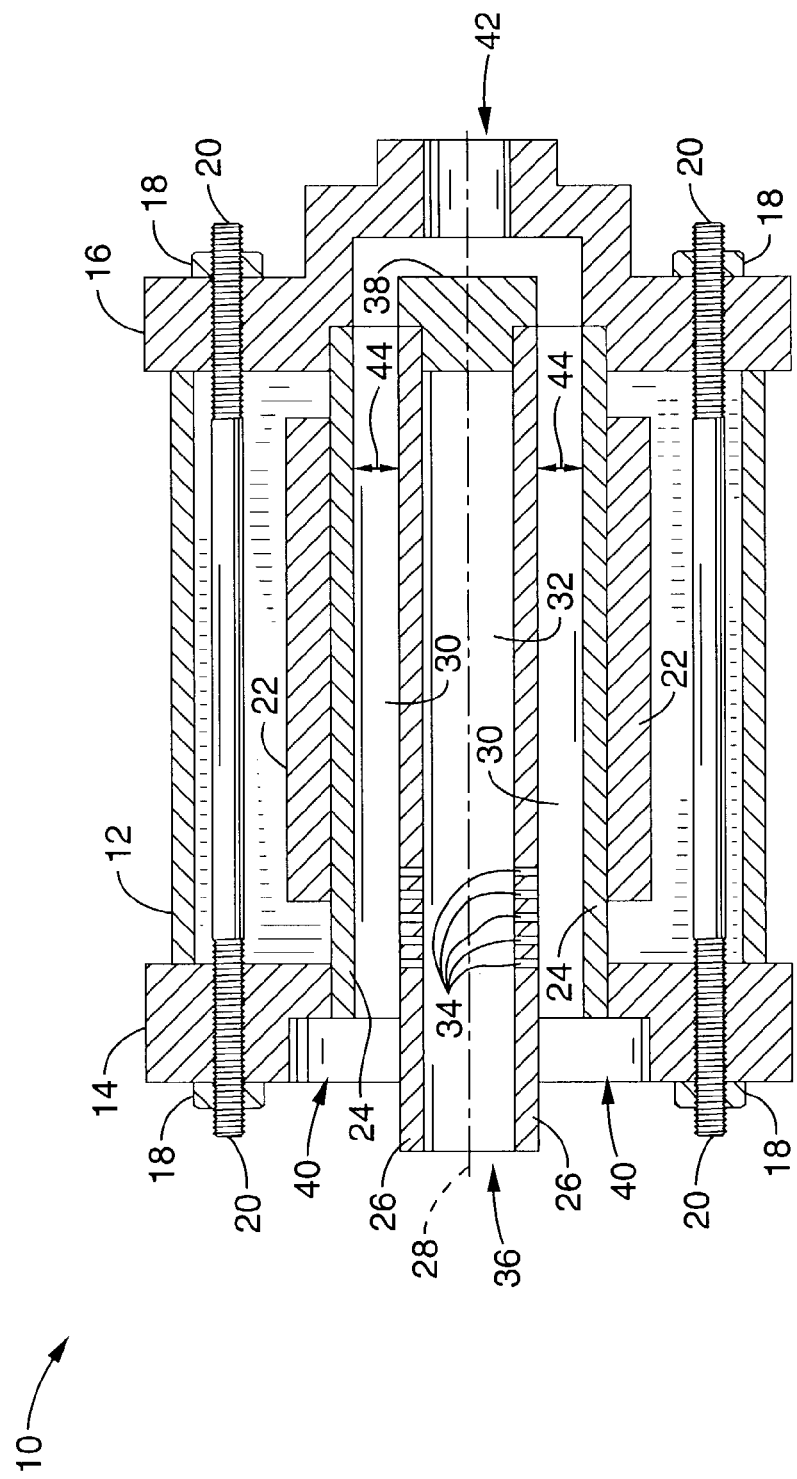
FIG. 2 is a cross-section view of the first embodiment of the SDP/DBD reactor taken along line 2—2 in FIG. 1.

FIGS. 1 and 2 show a first embodiment of a silent discharge plasma/dielectric-barrier discharge (SDP/DBD) reactor according to the present invention, generally designated 10. As shown in FIGS. 1 and 2, the reactor 10 includes a generally cylindrical housing 12 disposed between a generally disk-shaped inlet end cap 14 and a generally disk-shaped outlet end cap 16. FIGS. 1 and 2 show that the end caps 14, 16 can be removably engaged with the housing 10 using plural nuts 18 and plural bolts 20, but it can be appreciated that any other fastening means well known in the art can be used.

FIG. 2 shows that the reactor 10 includes a metal, generally cylindrical high-voltage (HV) electrode 22 that is disposed within the housing 12 between the end caps 14, 16. In a preferred embodiment, the HV electrode 22 is connected to an alternating current (AC) source or a pulsed direct current (DC) source. Moreover, a generally cylindrical, dielectric tube 24 is disposed within the HV electrode 22 such that the HV electrode 22 closely surrounds the dielectric tube 24. Preferably, the dielectric tube 24 is made from a dielectric material, e.g., glass, ceramic, etc.

As shown in FIG. 2, a metal, generally cylindrical injection/extraction gas supply tube 26 is disposed within the dielectric tube 24. The injection/extraction gas supply tube 26 is electrically grounded and can be considered a ground electrode. It is to be understood that the HV electrode 22 and the tubes 24, 26 are concentric to each other and are centered on a central axis 28 established by the reactor 10. Moreover, it is to be understood that the dielectric tube 24 establishes a dielectric barrier or layer between the HV electrode 22 and the grounded injection/extraction gas supply tube 26.

FIG. 2 shows that a gas modification passage 30 is established between the injection/extraction gas supply tube 26 and the dielectric tube 24. Also, an injection/extraction gas passage 32 is established within the injection/extraction gas supply tube 26. Plural injection/extraction gas holes 34 are established laterally within the injection/extraction gas supply tube 26 and connect the injection/extraction gas passage 32 to the gas modification passage 30.

As shown in FIG. 2, one end of the injection/extraction gas supply tube 26 establishes an injection/extraction gas inlet 36. A plug 38 is disposed within the other end of the injection/extraction gas supply tube 26. FIG. 2 further shows that the reactor 10 also includes a process gas inlet 40 established by the inlet end cap 14. The process gas inlet 40 leads to the gas modification passage 30. Also, a modified process gas outlet 42 is established by the outlet end cap 16 and leads from the gas modification passage 30.

It is to be understood that when the HV electrode 22 is energized, nonthermal electrical microdischarges occur between the HV electrode 22 and the grounded injection/extraction gas supply tube 26 across the dielectric barrier established by the dielectric tube 24. The nonthermal electrical microdischarges occur within the gas modification passage 30 and the width of the gas modification passage 30 defines a discharge gap 44. Preferably, the discharge gap 44 is between one and several millimeters (e.g., 1–10 mm).

It is to be understood that an injection/extraction gas is supplied to the injection/extraction gas inlet 36 and flows through the injection/extraction gas passage 32, through the injection/extraction gas holes 34, and into the gas modification passage 30. A process gas is supplied to the process gas inlet 40 and flows through the gas modification passage 30. It is to be understood that the process gas can be ambient air, a noble gas, natural gas, a gas mixture, etc.

When the HV electrode 22 is energized, nonthermal electrical microdischarges occur between the dielectric tube 24 and the grounded injection/extraction gas supply tube 26. As the process gas flows through the gas modification passage 30 and the injection/extraction gas flows through the injection/extraction gas passage 32, the SDP/DBD reactor 10 can be used to generate highly reactive chemical species, such as free radicals. These reactive species, e.g., O-atoms, OH-radicals, N-radicals, excited $N_2$ and $O_2$ molecules, $HO_2$-radicals, NH-radicals, CH-radicals, etc., readily decompose organic chemicals (e.g., VOCs), oxides of sulfur and nitrogen ($SO_2$ and NOx), and odor agents (e.g., aldehydes, $H_2S$ and many others) by breaking their chemical bonds. The result is the production of nonhazardous or easily-managed products. The free radicals and other active species, described above, can also play a key role in chemical synthesis, producing desirable products, e.g., creating higher-order hydrocarbon fuels from methane/natural gas. Moreover, nonthermal plasmas can be created by several types of electric discharge configurations.

In this exemplary, non-limiting embodiment of the invention, the reactor 10 utilizes a dielectric-barrier discharge arrangement, i.e., the HV electrode 22, the dielectric tube 24, and the grounded injection/extraction gas supply tube 26. The two conducting electrodes, i.e., the HV electrode 22 and the grounded injection/extraction gas supply tube 26, are separated by a relatively thin gas-containing space, i.e., the gas modification passage 30. The HV electrode 22 is covered by a dielectric material, i.e., the dielectric tube 24. As described in detail below, it can be appreciated that the grounded injection/extraction gas supply tube 26 can also be covered by a dielectric layer.

A high-voltage signal, e.g., alternating current with a frequency in a range of ten Hertz to twenty kiloHertz (10 Hz–20 kHz) is applied to the HV electrode 22 and the grounded injection/extraction gas supply tube 26 (which also serves as an electrode) thereby creating electrical-discharge streamers (microdischarges) in the gas modification passage 30. It is to be understood that the discharges are the source of the active nonthermal plasma.

It can be appreciated that the reactor 10 of the present invention can reduce hazardous compound concentrations in off-gases to very low levels by free-radical "cold combustion." Or, the reactor 10 can synthesize desirable chemical products using gaseous feedstocks. Because this invention provides for the injection of additive chemical compounds, e.g., ammonia, hydrocarbons, etc., into the gas modification passage 30, additional reactive species can be created.

Figure 3:
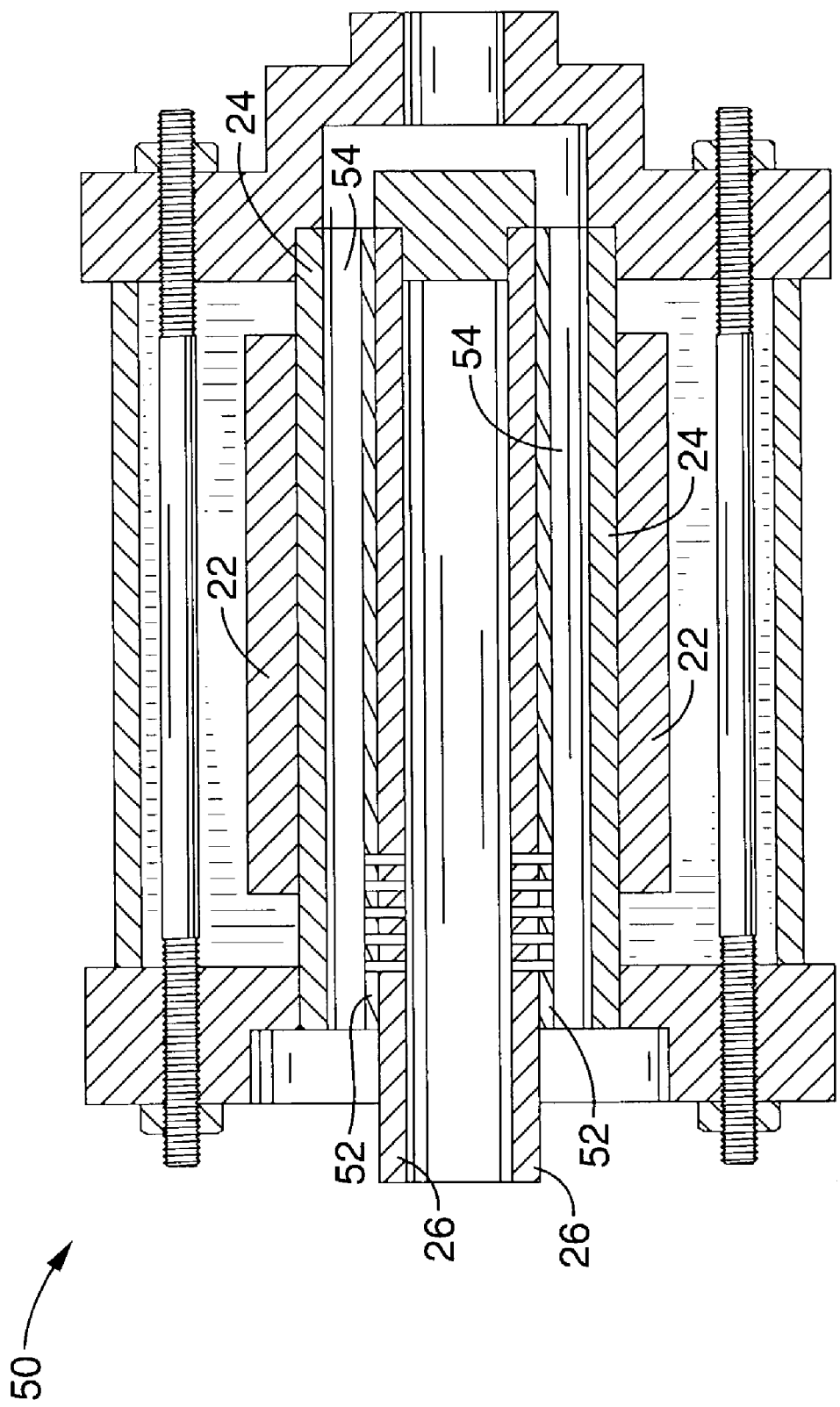
FIG. 3 is a cross-section view of a second embodiment of the SDP/DBD reactor.

FIG. 3 shows a second embodiment of a SDP/DBD reactor according to the present invention, generally designated 50. As shown in FIG. 3, the reactor 50 is similar in every aspect to the reactor shown in FIGS. 1 and 2 except for the addition of a second dielectric tube 52 that circumscribes an injection/extraction gas supply tube 26. Accordingly, as intended by this embodiment of the present invention, a gas modification passage 54 is established between the first dielectric tube 24 and the second dielectric tube 52. Moreover, nonthermal electrical microdischarges can occur between the HV electrode 22 and the injection/extraction gas supply tube 26 across both dielectric tubes 24, 52.

Figure 4:
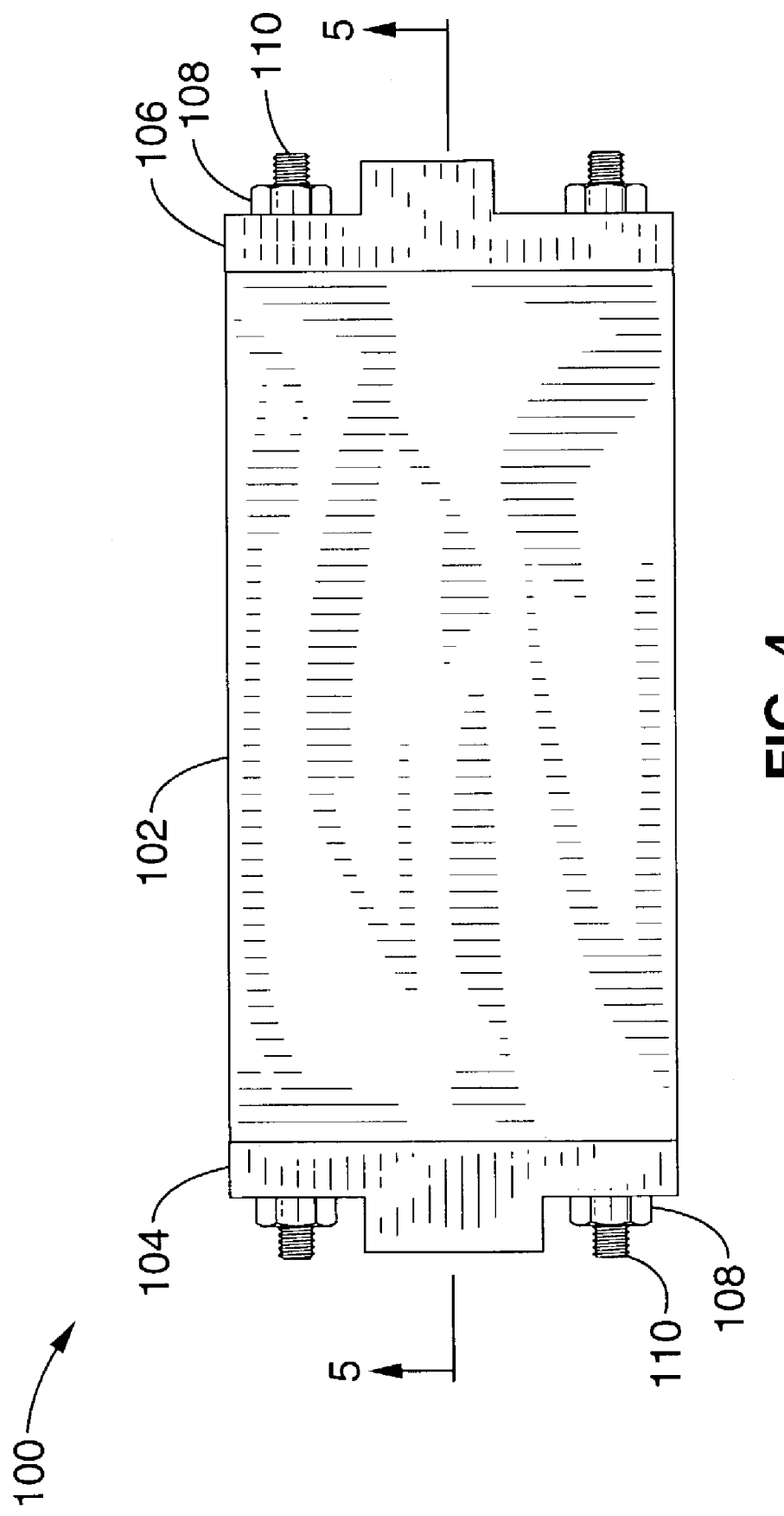
FIG. 4 is a side plan view of a third embodiment of a SDP/DBD reactor.
Figure 5:
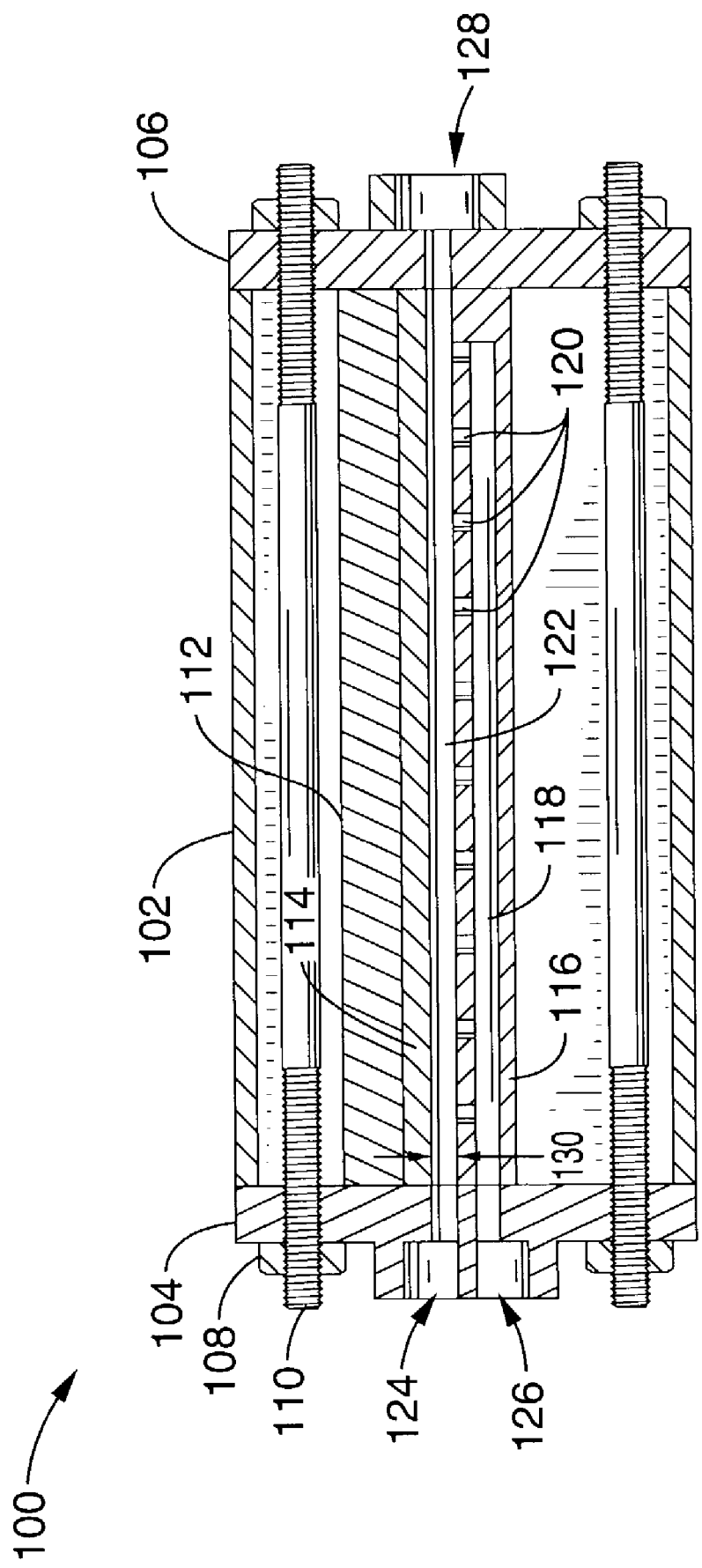
FIG. 5 is a cross-section view of the third embodiment of the SDP/DBD reactor taken along line 5—5 in FIG. 4.
Figure 6:
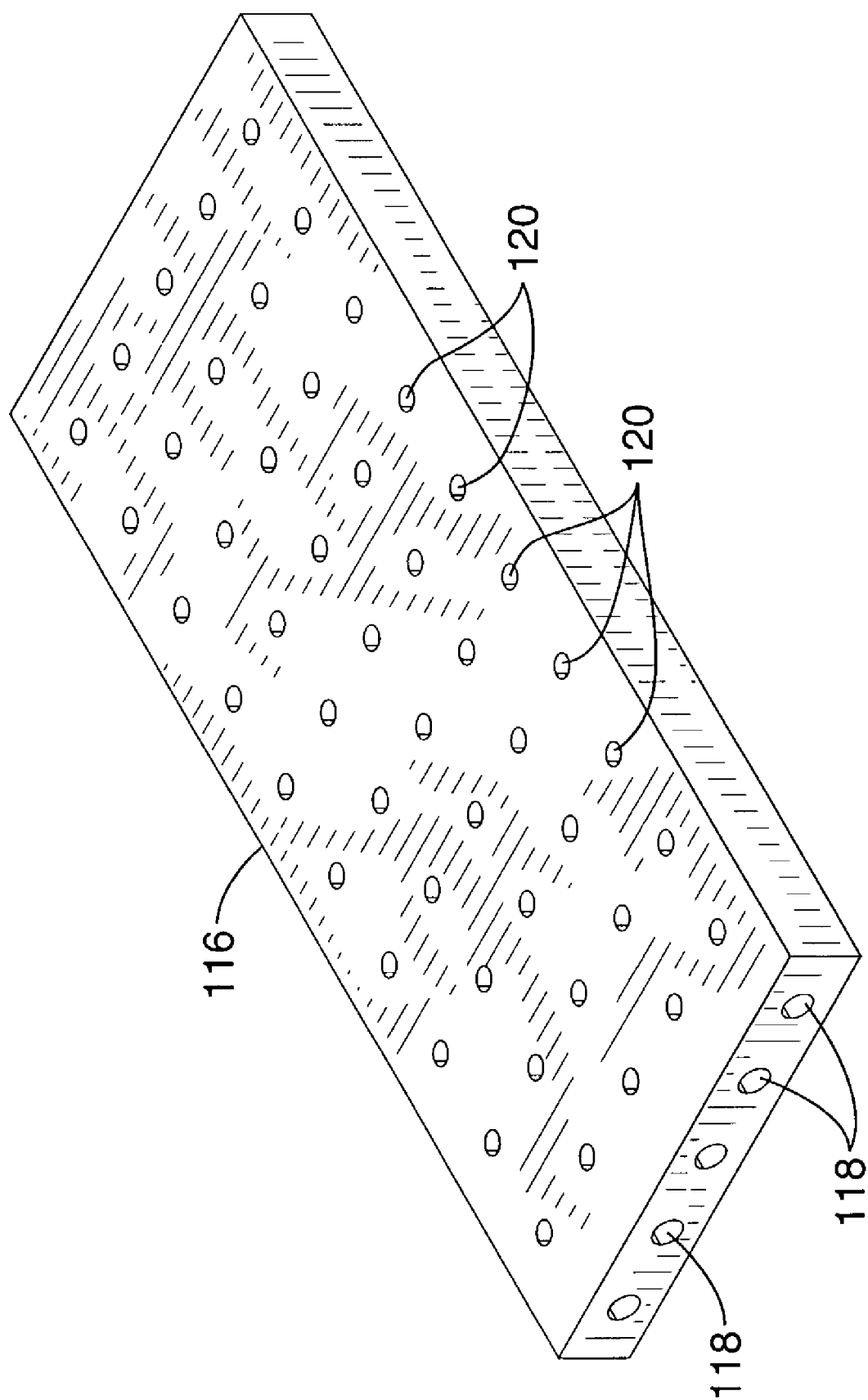
FIG. 6 is a perspective view of an injection/extraction gas manifold/ground electrode.

FIGS. 4 and 5 show a third embodiment of a SDP/DBD reactor according to the present invention, generally designated 100. As shown in FIGS. 4 and 5, the reactor 100 includes a generally rectangular housing 102 disposed between a generally flat, rectangular, plate-shaped inlet end cap 104 and a generally flat, rectangular, plate-shaped outlet end cap 106. FIGS. 4 and 5 show that the end caps 104, 106 can be removably engaged with the housing 100 using plural nuts 108 and plural bolts 110, but it can be appreciated that any other fastening means well known in the art can be used.

FIG. 5 shows that the reactor 100 includes a metal, generally flat, rectangular, plate-shaped high-voltage (HV) electrode 112 that is disposed within the housing 102 between the end caps 104, 106. Preferably, the HV electrode 112 is connected to an alternating current (AC) source or a pulsed direct current (DC) source. Moreover, a generally flat, rectangular dielectric plate 114 is disposed within the reactor 100 adjacent to the HV electrode 112. Preferably, the dielectric plate 114 is made from a material such as glass, ceramic, etc. As shown in FIG. 5, a metal, generally flat, rectangular injection/extraction gas manifold 116 is disposed within the reactor 100 such that it is slightly spaced from the dielectric plate 114. It is to be understood that the injection/extraction gas manifold 116 is electrically grounded and can be formed with one or more injection/ extraction gas passages 118—each passage 118 can further have plural injection/extraction gas holes 120 leading therefrom (see, e.g., FIG. 6).

As shown in FIG. 5, a gas modification passage 122 is established between the injection/extraction gas manifold 116 and the dielectric plate 114. The injection/extraction gas holes 120 provide fluid communication between the injection/extraction gas passages 118 and the gas modification passage 122. FIG. 5 further shows that the inlet end cap 104 is formed with a process gas inlet 124 that leads to the gas modification passage 122 and an injection/extraction gas inlet 126 that leads to the injection/extraction gas passages 118. Also, a modified process gas outlet 128 is established by the outlet end cap 106 and leads from the gas modification passage 122.

It is to be understood that when the HV electrode 112 is energized, nonthermal electrical microdischarges occur between the dielectric plate 114 and the grounded injection/extraction gas manifold 116. The nonthermal electrical microdischarges occur within the gas modification passage 122 and the width of the gas modification passage 122 defines a discharge gap 130. Preferably, the discharge gap 130 is between one and several millimeters (e.g., 1–10 mm). It can be appreciated that as a process gas and an injection/extraction gas flow through the gas modification passage 122, the process gas is modified by the nonthermal electrical microdischarges within the gas modification passage 122, as described in detail above.

Figure 7:
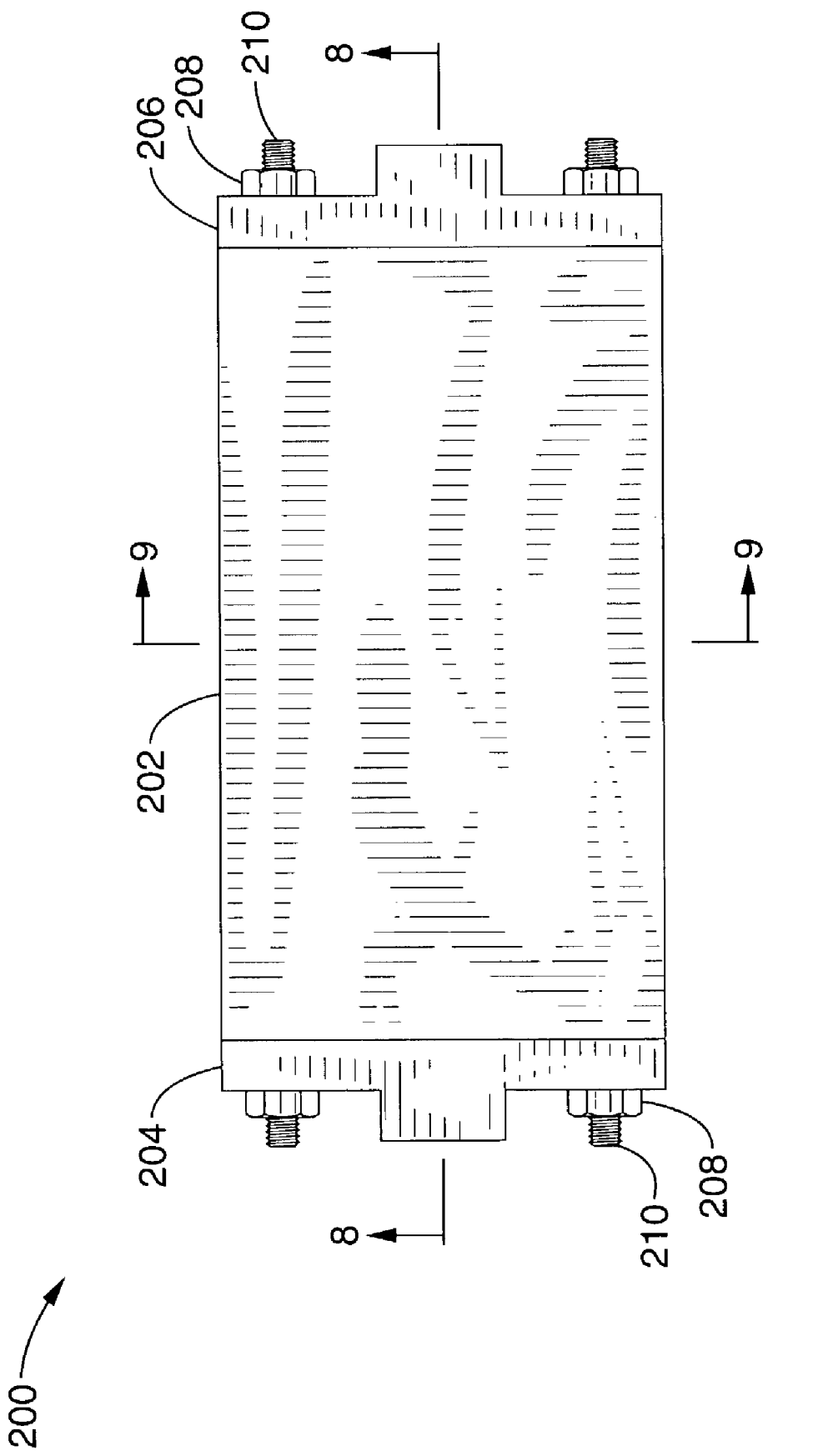
FIG. 7 is a side plan view of a fourth embodiment of a SDP/DBD reactor.
Figure 8:
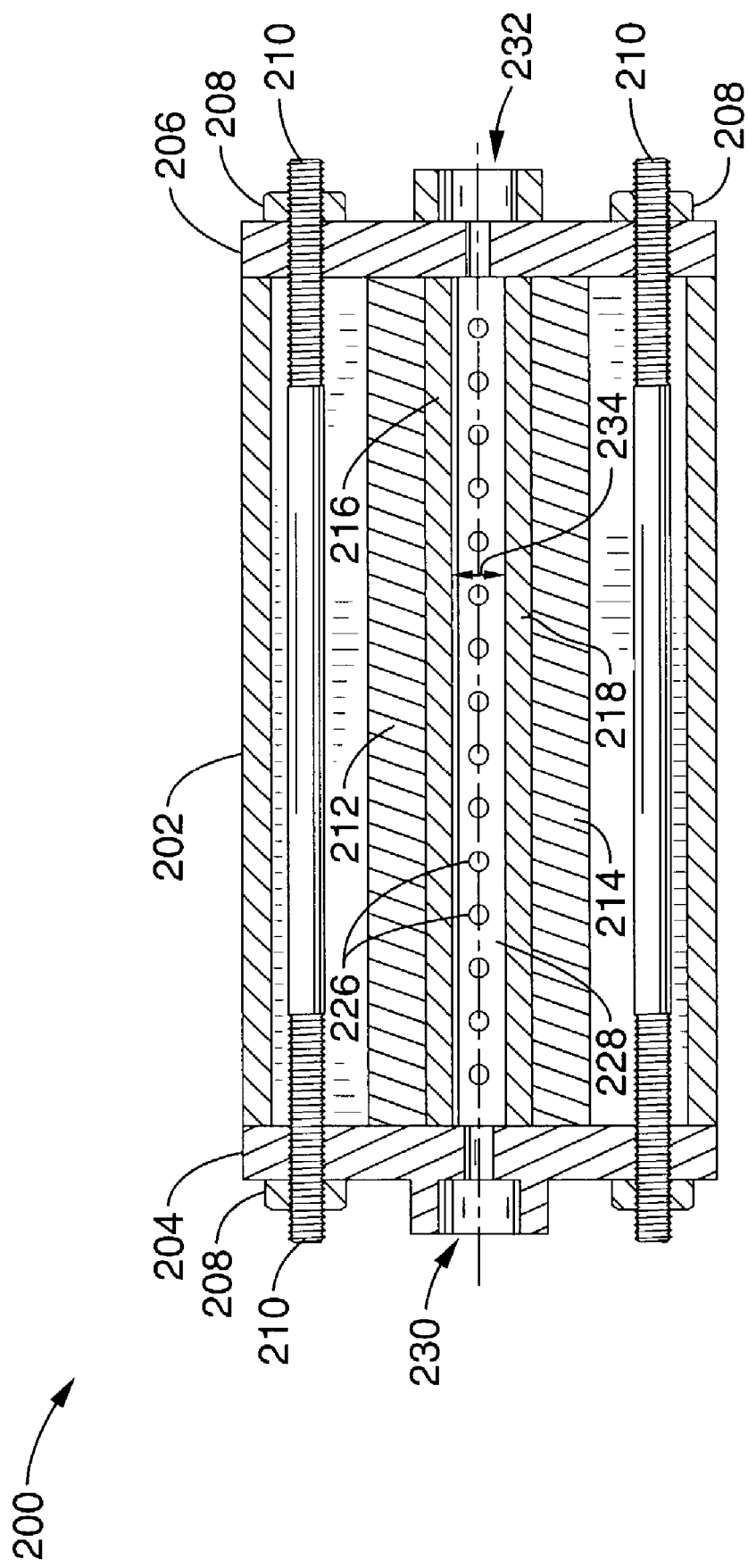
FIG. 8 is a cross-section view of the fourth embodiment of the SDP/DBD reactor taken along line 8—8 in FIG. 7.
Figure 9:
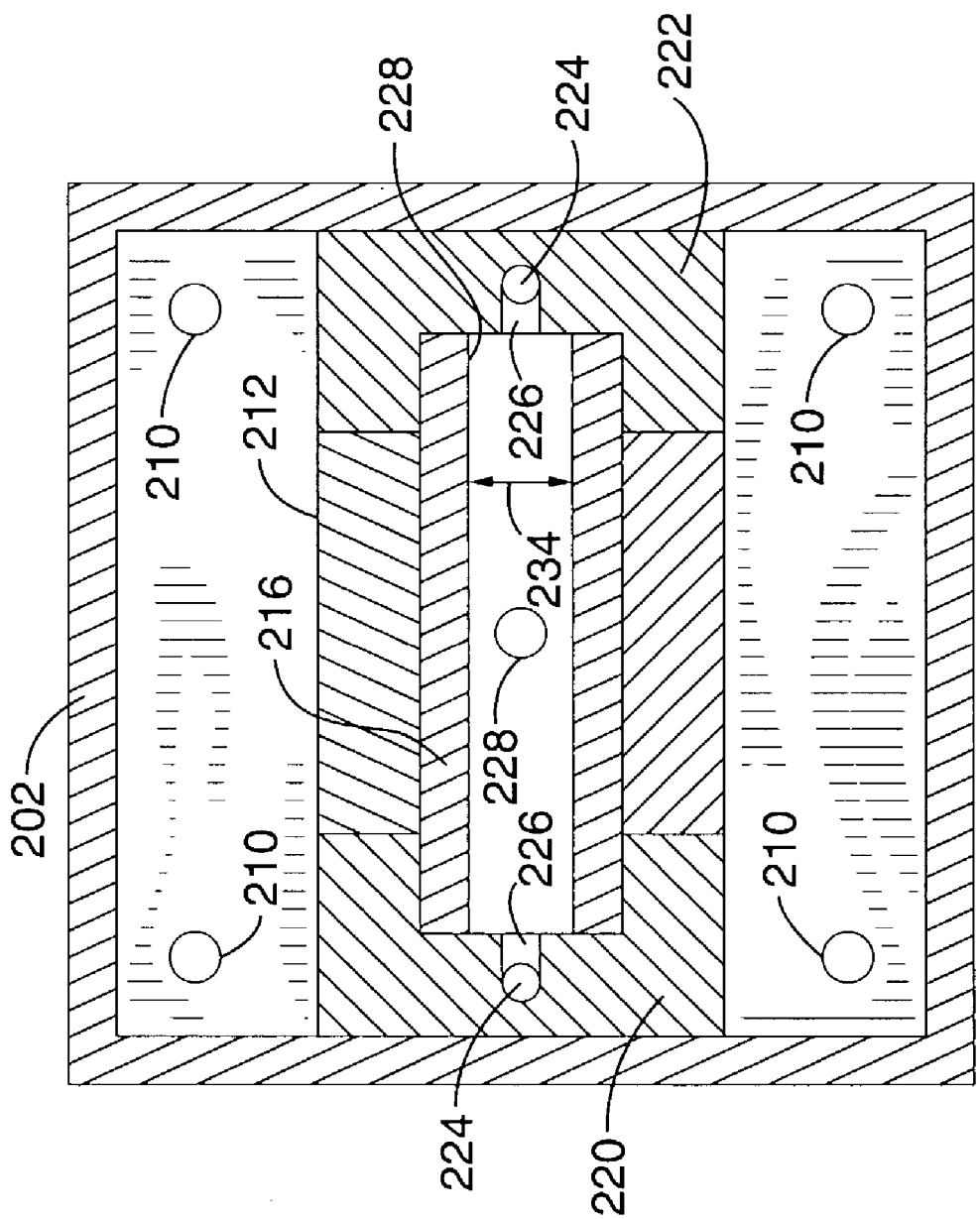
FIG. 9 is a cross-section view of the fourth embodiment of the SDP/DBD reactor taken along line 9—9 in FIG. 7.

Referring now to FIGS. 7, 8, and 9, a fourth embodiment of a SDP/DBD reactor according to the present invention is shown and is generally designated 200. As shown in FIGS. 7, 8, and 9, the reactor 200 includes a generally rectangular housing 202 disposed between a generally flat, rectangular, plate-shaped inlet end cap 204 and a generally flat, rectangular, plate-shaped outlet end cap 206. FIGS. 7, 8, and 9 show that the end caps 204, 206 can be removably engaged with the housing 200 using plural nuts 208 and plural bolts 210, but it can be appreciated that any other fastening means well known in the art can be used.

FIG. 8 shows that the reactor 200 includes a metal, generally flat, rectangular, plate-shaped high-voltage (HV) electrode 212 disposed within the housing 202 between the end caps 204, 206. Also, a metal, generally flat, rectangular, plate-shaped ground electrode 214 is disposed within the housing 202 and is slightly spaced from the HV electrode 212. Preferably, the HV electrode 212 is connected to an alternating current (AC) source or a pulsed direct current (DC) source and the ground electrode 214 is electrically grounded.

As shown, a generally flat, rectangular first dielectric plate 216 is disposed within the reactor 200 immediately adjacent to the HV electrode 212 between the HV electrode 212 and the ground electrode 214. Moreover, a generally flat, rectangular second dielectric plate 218 is disposed within the reactor 200 immediately adjacent to the ground electrode 214 between the HV electrode 212 and the ground electrode 214. Preferably, the dielectric plates 216, 218 are made from a material such as glass, ceramic, etc.

As shown in FIG. 9, a generally "C" shaped first injection/extraction gas manifold 220 is disposed within the reactor 200 such that it partially surrounds the dielectric plates 216, 218. A generally "C" shaped second injection/extraction gas manifold 222 is disposed within the reactor 200 opposite the first injection/extraction gas manifold 220 such that the second injection/extraction gas manifold 222 partially surrounds the dielectric plates 216, 218 opposite the first injection/extraction gas manifold 220. FIGS. 8 and 9 show that each injection/extraction gas manifold 222 is formed with an injection/extraction passage 224 having plural injection/extraction gas holes 226 leading therefrom. The plural injection/extraction gas holes 226 lead to a gas modification passage 228 that is established between the dielectric plates 216, 218.

FIG. 8 further shows that the inlet end cap 204 is formed with a process gas inlet 230 that leads to the gas modification passage 228. Also, a modified process gas outlet 232 is established by the outlet end cap 206 and leads from the gas modification passage 228. It is to be understood that when the HV electrode 212 is energized, nonthermal electrical microdischarges occur between the HV electrode 212 and the ground electrode 214 across the dielectric plates 216, 218. These nonthermal electrical microdischarges occur within the gas modification passage 228 and the width of the gas modification passage 228 defines a discharge gap 234. Preferably, the discharge gap 234 is between one and several millimeters (e.g., 1–10 mm). It can be appreciated that as a process gas and an injection/extraction gas flow through the gas modification passage 228, the process gas is modified by the nonthermal electrical microdischarges within the gas modification passage 228, as described in detail above.

Figure 10:
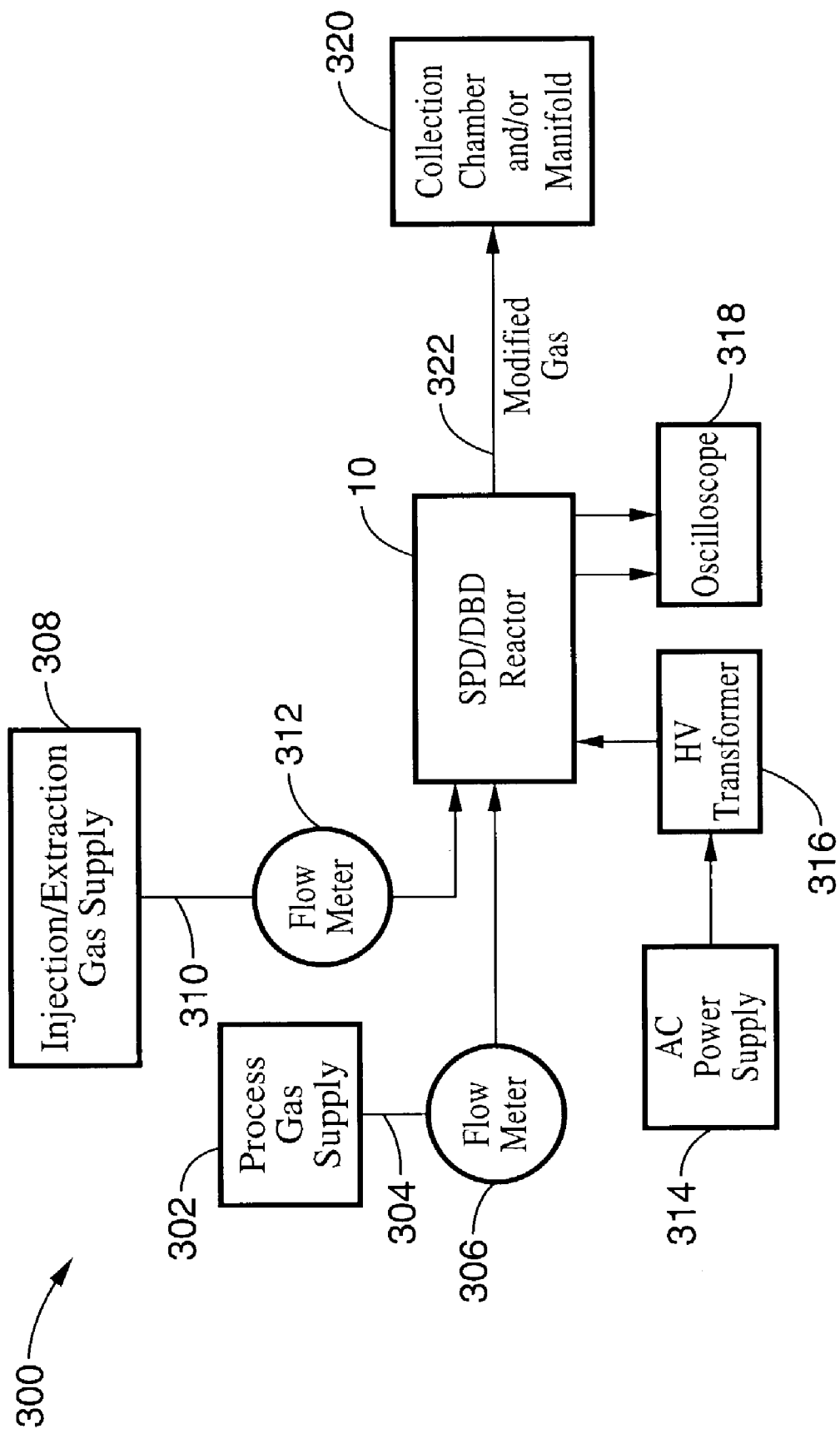
FIG. 10 is a block diagram of a non-limiting, exemplary combustion system.

Referring now to FIG. 10, a non-limiting, exemplary gas-processing system is shown and is generally designated 300. FIG. 10 shows that the system 300 includes an SDP/DBD reactor, e.g., the reactor 10 shown in FIGS. 1 and 2 and described in detail above. A process gas supply 302 is connected to the SDP/DBD reactor 10 via a process gas fluid line 304. A process gas flow meter 306 is installed along the process gas fluid line 304 to monitor the flow of process gas to the SDP/DBD reactor 10. Also, an injection/extraction gas supply 308 is connected to the SDP/DBD reactor 10 via an injection/extraction gas fluid line 310. An injection/extraction gas flow meter 312 is installed along the injection/extraction gas fluid line 310 to monitor the flow of injection/extraction gas to the reactor 10. It can be appreciated that the process gas supply 302 is connected to the process gas inlet 40 (FIG. 2) and the injection/extraction gas supply 308 is connected to the injection/extraction gas inlet 36 (FIG. 2).

As further shown in FIG. 10, a power supply 314, e.g., an AC power supply, is connected to the SDP/DBD reactor 10 via a high voltage (HV) transformer 316. Moreover, an oscilloscope 318 is also connected to the SDP/DBD reactor 10 and can be used to monitor the current and voltage of the signal that is applied to the SDP/DBD reactor 10 in order to create the nonthermal electrical microdischarges that are necessary to modify the process gas flowing through the reactor 10. FIG. 10 also shows that the SDP/DBD reactor 10 can be connected to an outlet manifold 320 by a modified gas fluid line 322 that provides modified gas to the manifold 320.

Accordingly, it can be seen that this invention provides a means for effectively destroying air pollutants or undesirable chemicals or biological agents in a process gas, e.g., a polluted or contaminated gas. This invention can also effectively synthesize chemical compounds by adding useful chemical ions to a process gas.

A greater variety of active species, including various free radicals, can be achieved and accompanied by greater effective active species yields (number per unit energy). Moreover, certain chemical additives can create more homogeneous dielectric barrier discharges. With a more homogeneous discharge, the active species/radicals are spread over a larger volume and have lower peak concentrations, so there is less competition from radical-radical interactions which tend to reduce the concentrations of active species. Therefore, more active species survive to react with entrained pollutants or feed gas species.

It can be understood that various "active" and "inactive" regions can be established within the reactor using segmented electrodes (some of which can be injectors with variable injection/extraction gas hole sizes). The results include variable pump power, i.e., specific energy deposition, over different reactor spatial regions which further results in better control over the plasma chemistry because some chemical reactions are favored in "inactive" regions or vice-versa. It is also to be understood that the device can be used over a wide range of process gas pressures, e.g., a millitorr to a few atmospheres.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A device for processing gases, comprising:
   a high voltage electrode;
   a ground electrode slightly spaced from the high voltage electrode;
   a dielectric layer disposed adjacent to the high voltage electrode between the high voltage electrode and the ground electrode;
   a gas modification passage established within the housing between the dielectric layer and the ground electrode;
   a process gas inlet configured to deliver a process gas to the gas modification passage; and
   an additive gas supply inlet configured to inject an additive gas to the gas modification passage;
   wherein the ground electrode is established by an additive gas supply tube;
   the additive gas supply tube having a first end forming the additive gas supply inlet at the process gas inlet and a second end extending internal to the high voltage electrode to form an inner wall of the gas modification passage;
   wherein the additive gas supply tube is in direct fluid communication with the gas modification passage to inject the additive gas into the gas modification passage independent from the process gas such that at least a portion of the additive gas is injected independently into a location in the gas modification passage that is downstream from the process gas inlet.

2. A device as recited in claim 1, wherein the high voltage electrode is energizable to create nonthermal electrical microdischarges between the high voltage electrode and the ground electrode across the dielectric layer; and
   wherein the additive gas supply tube is configured to independently deliver the additive gas to a plurality of spaced-apart locations along the gas modification passage downstream from the process gas inlet and at the location of the nonthermal electrical microdischarges.

3. A device as recited in claim 2, wherein the additive gas is injected at the plurality of spaced-apart locations to independently and directly interact with the nonthermal electrical microdischarges.

4. A device as recited in claim 1, wherein the high voltage electrode is cylindrical.

5. A device as recited in claim 4, wherein:
   the additive gas supply tube has a plurality of spaced-apart holes located downstream from the additive gas supply inlet to independently inject the additive gas downstream from the process gas inlet.

6. A device as recited in claim 5, wherein the dielectric layer is established by a dielectric tube, the dielectric tube being circumscribed by the high voltage electrode.

7. A device as recited in claim 6, wherein the high voltage electrode, the additive gas supply tube and the dielectric tube are concentric to each other.

8. A device as recited in claim 7, wherein the gas modification passage is established between the dielectric tube and the additive gas supply tube.

9. A device as recited in claim 8, wherein the dielectric tube is a first dielectric tube and the device further comprises:
   a second dielectric tube circumscribing the additive gas supply tube.

10. A device as recited in claim 9, wherein the gas modification passage is established between the first dielectric tube and the second dielectric tube.

11. A device as recited in claim 1, wherein the high voltage electrode is a rectangular plate.

12. A device as recited in claim 11, wherein the additive gas supply tube comprises a rectangular additive gas manifold, the additive gas manifold in direct fluid communication with the additive gas supply inlet and forming at least one additive gas passage in fluid communication with the gas modification passage and downstream from the process gas inlet.

13. A device as recited in claim 12, wherein the dielectric layer is established by a rectangular plate.

14. A device as recited in claim 11, wherein the ground electrode is established by a rectangular plate slightly spaced from the high voltage electrode.

15. A device as recited in claim 11, wherein the dielectric layer is a first dielectric layer established by a rectangular plate and the device further comprises:
   a second dielectric layer, the second dielectric layer being established by a rectangular plate, the gas modification passage being established between the first dielectric layer and the second dielectric layer.

16. A device as recited in claim 15, further comprising:
   at least one additive gas manifold in direct fluid communication with the additive gas supply inlet and at least partially flanking the first dielectric layer and the second dielectric layer, the additive gas manifold independently providing additive gas to the gas modification passage at one or more locations downstream from the process gas inlet.

17. A device for processing gases, comprising:
a gas modification passage defining a length;
means for supplying a process gas to the gas modification passage at a process gas inlet;
means for creating nonthermal electrical microdischarges at least partially along the length of the gas modification passage;
means for injecting an additive gas directly into the gas modification passage independently from the process gas supply means at one or more locations downstream from the process gas inlet and at the location of the nonthermal electrical microdischarges;
wherein the means for creating nonthermal electrical microdischarges comprises:
at least one high voltage electrode;
at least one ground electrode slightly spaced from the high voltage electrode;
at least one dielectric layer disposed between the high voltage electrode and the ground electrode, the dielectric layer being adjacent to one of: the high voltage electrode or the ground electrode; and
wherein the ground electrode comprises the additive gas injecting means;
wherein the additive gas injecting means is configured to independently and internally deliver the additive gas to a plurality of spaced-apart locations along the gas modification passage such that the additive gas interacts independently with the nonthermal electrical microdischarges generated downstream from the process gas inlet.

18. A device as recited in claim 17, wherein the gas modification passage is established between the high voltage electrode and the ground electrode at least partially along the length of the dielectric layer.

19. A device as recited in claim 18, wherein the high voltage electrode is energizable to create nonthermal electrical microdischarges between the high voltage electrode and the ground electrode across the dielectric layer.

20. A device for processing gases, comprising:
a cylindrical housing;
a metal additive gas supply tube disposed coaxially within the cylindrical housing;
wherein the metal additive gas supply tube comprises a ground electrode;
a first dielectric tube surrounding the additive gas supply tube;
a gas modification passage established between the additive gas supply tube and the first dielectric tube;
a process gas inlet configured to deliver a process gas into the gas modification passage;
wherein the additive gas supply tube is in direct fluid communication with the gas modification passage and is configured to directly inject an additive gas into the gas modification passage independent from the process gas at a location downstream from the process gas inlet; and
a metal high voltage electrode circumscribing the first dielectric tube, the high voltage electrode being energizable to create nonthermal electrical microdischarges between the high voltage electrode and the additive gas supply tube at least partially along the length of the gas modification passage.

21. A device as recited in claim 20, further comprising:
a process gas supply in fluid communication with the gas modification passage via the process gas inlet, the process gas supply providing the process gas to the gas modification passage.

22. A device as recited in claim 21, further comprising:
an additive gas supply in fluid communication with the gas modification passage via the additive gas supply tube, the additive gas supply providing the additive gas to the gas modification passage.

23. A device as recited in claim 22, further comprising:
a combustion chamber in fluid communication with the gas modification passage, the gas modification passage providing a modified gas to the combustion chamber.

24. A device as recited in claim 20, further comprising:
a second dielectric tube circumscribing the additive gas supply tube, the gas modification passage being established between the first dielectric tube and the second dielectric tube.

25. A device for processing gases, comprising:
a rectangular box-shaped housing;
a metal, rectangular, plate-shaped additive gas manifold within the housing, the additive gas manifold being formed with at least one additive gas passage;
a rectangular, dielectric plate slightly spaced from the additive gas manifold;
a gas modification passage established between the ground electrode and the dielectric layer;
a process gas inlet in fluid communication with the gas modification passage, the process gas inlet configured to deliver a process gas into the gas modification passage;
wherein the at least one additive gas passage is in direct fluid communication with the gas modification passage and is configured to inject the additive gas directly into the gas modification passage independently from the process gas at a location downstream from the process gas inlet; and
a metal, rectangular, plate-shaped high voltage electrode adjacent to the dielectric layer, the high voltage electrode being energizable to create nonthermal electrical microdischarges between the high voltage electrode and the additive gas manifold at least partially along the length of the gas modification passage;
wherein the additive gas manifold comprises a ground electrode;
said additive gas manifold having a first end forming an additive gas supply inlet at the process gas inlet and a second end extending internal to the high voltage electrode to form an inner wall of the gas modification passage.

26. A device as recited in claim 25, further comprising:
a process gas supply in fluid communication with the gas modification passage, the process gas supply providing the process gas to the gas modification passage.

27. A device as recited in claim 25, further comprising:
an additive gas supply in fluid communication with the gas modification passage via the additive gas manifold, the additive gas supply providing the additive gas to the gas modification passage.

* * * * *